United States Patent [19]

Moloney et al.

[11] Patent Number: 5,200,653
[45] Date of Patent: Apr. 6, 1993

[54] TRISTATE OUTPUT GATE STRUCTURE PARTICULARLY FOR CMOS INTEGRATED CIRCUITS

[75] Inventors: David Moloney, Cornaredo; Gianfranco Vai, Pavia; Maurizio Zuffada; Giorgio Betti, both of Milan, all of Italy

[73] Assignee: SGS-Thomson Microelectronics S.r.l., Italy

[21] Appl. No.: 718,669

[22] Filed: Jun. 21, 1991

[30] Foreign Application Priority Data

Jun. 22, 1990 [IT] Italy ................. 20728 A/90

[51] Int. Cl.⁵ ................. H03K 19/017; H03K 19/094
[52] U.S. Cl. ................. 307/473; 307/475; 307/451; 307/443
[58] Field of Search ................. 307/473, 475, 451, 443

[56] References Cited

U.S. PATENT DOCUMENTS

| | | | |
|---|---|---|---|
| 4,345,172 | 8/1982 | Kobayashi et al. | 307/473 |
| 4,465,945 | 8/1984 | Yin | 307/473 |
| 4,717,846 | 1/1988 | Ando | 307/473 |
| 5,027,012 | 6/1991 | Saeki et al. | 307/473 |
| 5,034,637 | 7/1991 | Jungert | 307/473 |

FOREIGN PATENT DOCUMENTS

| | | |
|---|---|---|
| 61-25326 | 2/1986 | Japan . |
| 61-100024 | 9/1986 | Japan . |
| 62-194733 | 8/1987 | Japan . |
| 63-285025 | 11/1988 | Japan . |

Primary Examiner—Edward P. Westin
Assistant Examiner—Richard Roseen
Attorney, Agent, or Firm—Townsend and Townsend

[57] ABSTRACT

The tristate output gate structure particularly for CMOS integrated circuits, comprises an enable terminal receiving an enable signal and an input terminal receiving an input signal, which connects, through signal switching means, an output terminal to a positive power supply terminal or to a negative power supply terminal. The enable terminal can be electrically connected to the gate terminal of a first P-channel transistor through signal inverting means and to the gate terminal of a second N-channel transistor. The output terminal is electrically connected to the drain terminals of the first and second transistors. The first and second transistors electrically insulate the output terminal from the input terminal.

23 Claims, 2 Drawing Sheets

TRISTATE OUTPUT GATE STRUCTURE PARTICULARLY FOR CMOS INTEGRATED CIRCUITS

BACKGROUND OF THE INVENTION

The present invention relates to a tristate output gate structure particularly for CMOS integrated circuits.

The output gates of integrated circuits are currently manufactured with various methods which are able to avoid bus-conflict, which can occur on a connecting bus or line shared by various outputs of different integrated circuits, or by various outputs of a single complex integrated circuit.

In particular, and as described in greater detail hereinafter, tristate CMOS gates are very suitable for this purpose. Said gates currently have an input the effect whereof on the output is activated by means of a pair of enable channels arranged in input to said gate. Said channels are logically opposite to one another, and each enables a complementary-technology transistor. The output is connected between said two transistors.

The use of two inable signals is redundant and is also the source of manufacturing problems ahead of the output gate. Furthermore, in order to have outpus with a logic level which corresponds to the input, pairs of transistors made in the same technology and arranged in series are usually provided.

The problem arises, in this case, from the reaction times of the different pairs, one with P-channel transistors, the other with N-channel transistors.

A P-channel transistor is intrinsically slower, due to its execution, than an N-channel transistor, dimensions being equal.

Thus, in order to make their speeds equal, it is necessary to manufacture P-channel tansistors which are larger than N-channel transistors. However, this causes a corresponding increase in parasitic capacitors, which reach values higher than that of the N-channel transistor. This, combined with the intrinsic electric resistance of the P-channel transistor, entails a charge and discharge time constant, given by the product of the resistance and the value of the parasitic capacitor, which is greater than that of an N-channel transistor.

This effect is aggravated by the series arrangement of two P-channel transistors, since the time constants are not added but multiplied by one another, causing a quadratic increase in said time constant.

SUMMARY OF THE INVENTION

The aim of the present invention is to eliminate or substantially reduce the disadvantages described in known types of tristate gate by providing a tristate output gate structure particularly for CMOS integrated circuits which reduces the enable inputs.

Within the scope of the above aim, an object of the present invention is to provide a gate structure which eliminates the series connection of a plurality of P-channel transistors.

Another object of the present invention is to provide a gate structure which can be easily integrated in a CMOS integrated circuit.

Not least object of the present invention is to provide a gate structure which is relatively easy to manufacture and at competitive costs.

This aim, these objects and others which will become apparent hereinafter are achieved by a tristate output gate structure particularly for CMOS integrated circuits according to the invention, characterized in that it comprises an enable terminal receiving an enable signal, an input terminal receiving an input signal which connects, through signal switching means, an output terminal to a terminal of a positive power supply or to a terminal of a negative power supply, said enable terminal being electrically connectable to the gate terminal of a first P-channel transistor through signal inverting means and to the gate terminal of a second N-channel transistor, said output terminal being electrically connected to the drain terminals of said first and second transistors, said first and second tarnsistors being suitable for electrically insulating said output terminal from said input terminal.

BRIEF DESCRIPTION OF THE DRAWINGS

Further characteristics and advantages of the invention will become apparent from the description of some preferred but not exclusive embodiments of a tristate output gate structure particularly for CMOS integrated circuits, illustrated only by way of non-limitative example in the accompanying drawings, wherein.

DESCRIPTION OF THE PREFERRED EMBODIMENTS

Figure 1:
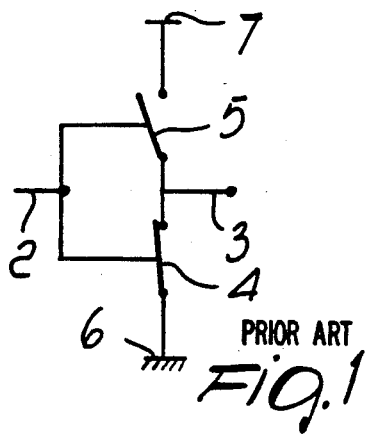
FIG. 1 is a conceptual diagram of an inverting logic gate.
Figure 2:
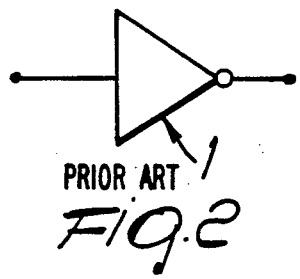
FIG. 2 is a symbolic schematic diagram of an inverting logic gate.

With reference to FIGS. 1 to 7, the inverting logic gates 1 are executed according to the conceptual diagram illustrated in FIG. 1. Said gate 1 comprises an input terminal 2 and an output terminal 3 which can be electrically connected respectively to a negative terminal 6 (ground) or to a positive terminal 7 by means of the switches 4 and 5 by the input terminal 2.

The operation of said gate is as follows: when a high logic value is present on the input terminal 2, the switch 4 is closed so as to connect the output terminal 3 to the negative voltage 6. Instead, when there is a low logic value on the input terminal 2, the switch 5 is closed, connecting the output terminal 3 to the positive voltage 7. The simultaneous closure of both switches 4 and 5 is impossible, since they are controlled by complementary logic values. Said gates are used to connect logic circuits to bus transmission channels 8, which are essential for the execution of electronic circuits with microprocessors and are furthermore shared by a considerable number of different logic circuits.

Figure 3:
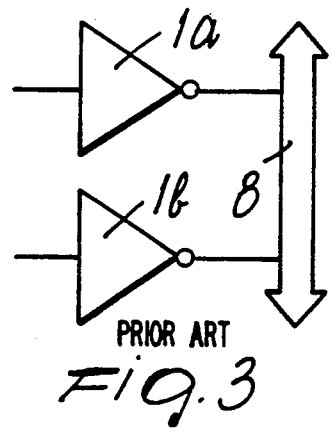
FIG. 3 is a schematic diagram of inverting gates output connections toward a bus.

The sharing of a bus 8 by a plurality of logic circuits, however, entails the possibility of the occurrence of so-called bus-conflict. In this case, as illustrated in FIG. 3, if an inverting gate 1a transmits a high logic value to the bus 8, while an inverting logic gate 1b transmits a low logic value to the bus 8, the logic value present on the bus 8 assumes an indefinite logic value. This causes bus-conflict.

Figure 4:
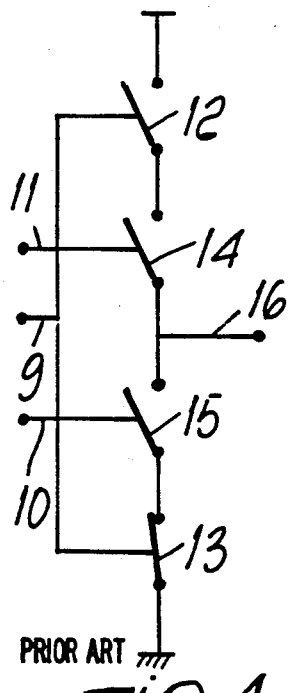
FIG. 4 is a conceptual diagram of a tristate inverting logic gate.

In order to obviate this problem, tristate inverting logic gates have been provided; their conceptual diagram is illustrated in FIG. 4.

The diagram has an input terminal 9 and two enabling terminals 10 and 11. The terminals 10 and 11 simultaneously assume complementary logic values. The input terminal 9 is electrically connected to swiches 12 and 13, the terminal 10 is connected to a switch 15 and the terminal 11 is connected to a switch 14. An output terminal 16 is arranged between the switches 14 and 15.

The operation of said gate is as follows: when the signals in the terminals 10 and 11 are inactive, i.e. logically low on the terminal 10 and high on the terminal 11, the switches 14 and 15 are open, electrically insulating the output 16, regardless of the value assumed by the input 9. Instead, when the terminals 10 and 11 are active, i.e. logically high on the terminal 10 and low on the terminal 11, the switches 14 and 15 are closed, connecting the terminal 16 to the node 21 or to the ground according to the logic values assumed by the input 9, which, as previously described for the structure illustrated in FIG. 1, close the switch 14 or the switch 15. Thus said gate has three states, i.e. a high logic value, a low logic value and a state of electric insulation from the communications bus.

Figure 5:
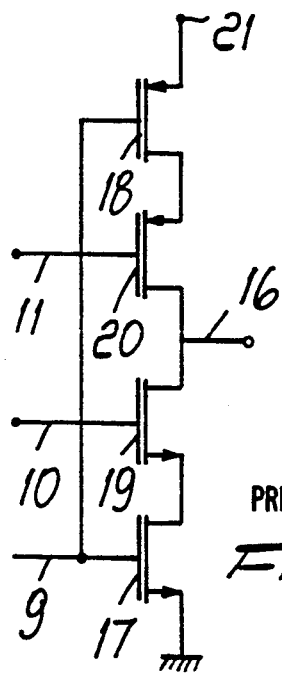
FIG. 5 is a schematic view of the execution of a tristate inverting logic gate.

The conventional execution of the conceptual diagram of FIG. 4 is the one illustrated in FIG. 5. Transistors replaces the switches.

The gate still has an input terminal 9 which is connected to the gate terminal of an N-channel transistor 17 and to the gate terminal of a P-channel transistor 18. The enable terminals 10 and 11 are respectively connected to the gate terminal of an N-channel transistor and to the gate terminal of a P-channel transistor 20. The transistor 17 has its source terminal connected to the ground and its drain terminal connected to the source terminal of the transistor 19.

The drain terminal of the transistor 19 is connected to the drain terminal of the transistor 20 and to the output terminal 16, whereas the source terminal of the transistor 20 is connected to the drain terminal of the transistor 18, the source terminal whereof is connected to the power supply 21.

The operation of the real inverting gate is as follows: when the logic values on the terminals 10 and 11 are low and high respectively, the transistors 19 and 20 are off, electrically insulating the output terminal 16 both from the positive power supply 21 and from the ground, regardless of the logic value present on the input 9. By observing the gate from the terminal 16, it can be seen that it has no logic value, but has a high impedance, which insulates the gate from the bus 8 as previously mentioned. If a high logic value and a low logic value are instead present on the terminals 10 and 11 respectively, the transistors 19 and 20 are both on. The logic value of the output 16 is complementary with respect to the logic value of the input 9 due to the action of the transistors 17 and 18.

The transistors thus provided are connected in series. The greatest problem in the execution of the gate as illustrated in FIG. 5 is related to the series of P-channel transistors. Said transistors are intrinsically slower than N-channel transistors of equal dimensions. Transistors in fact do not have the ideal characteristics of ideal switches, i.e. they have a resistance of their own and parasitic capacitors. In the case of P-channel transistors, this problem is aggravated by the fact that they are slower, by a factor comprised between two and three, than N-channel transistors. In order to compensate the above problem said P-channel transistors are made larger, by a factor comprised between two and three, than the corresponding N-channel transistors. This size increase, however, increases the parasitic capacitors of the P-channel transistors.

Figure 6:
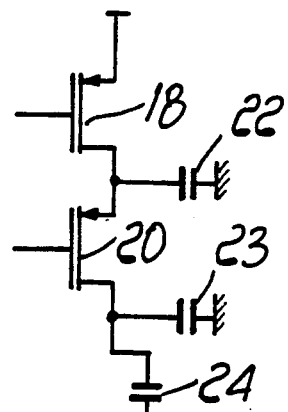
FIGS. 6 and 7 are schematic views of parasitic capacitive loads of the gate of FIG. 5.
Figure 7:
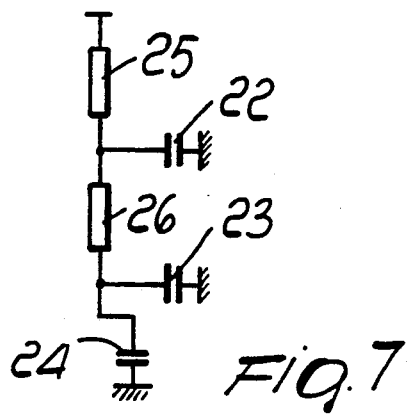

As illustrated in FIGS. 6 and 7, the transistors 18 and 20 are respectively affected by intrinsic parasitic capacitors 22 and 23, as well as by a charging capacitor 24. FIG. 7 illustrates the electric circuit which is the equivalent of FIG. 6. In said FIG. 7, the transistors are replaced with respective resistors 25 and 26. The charging time constant of each individual transistor is equal to the product of its own resistance and the value of its parasitic capacitor. For a series, the time constant of the series is equal to the product of the time constants of the individual transistors, i.e. is equal to the square of the time constant of the individual transistor. This slows the state change of the transistor even further.

In order to improve the characteristics of these gates, contrasting requirements are faced, which can be summarized as follows:

to maximize speed: reduction of the number of series transistors when this is possible, and/or enlargement of the transistors;

to minimize area: reduction of the number of transistors and/or of series-connected transistors, with a reduction in the area of each individual transistor.

Figure 8:
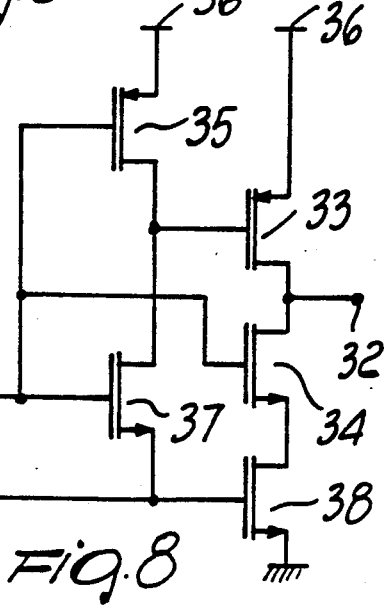
FIG. 8 is a schematic view of the execution of a tristate inverting output logic gate structure according to the invention.

In order to cope with the problem in a unitary manner, and also to reduce the number of enable terminals, a tristate output gate structure according to the invention has been provided which, with reference to FIG. 8, comprises a terminal 30 for an enable signal, a terminal 31 for an input signal, which connects, by virtue of signal switching means, a terminal for an output signal 32 to a positive power supply terminal or to a negative power supply or ground terminal. The enable terminal 30 is electrically connected to the gate terminal of a first P-channel transistor 33 and is electrically connected to the gate terminal of a second N-channel transistor 34. The output terminal 32 is connected to a node which is constituted by the drain terminals of the first transistor 33 and of the second transistor 34, these last constituting the signal switching means. The transistors 33 and 34 can electrically insulate the output terminal 32.

The enable terminal 30 is connected to the gate terminal of a third P-channel transistor 35 the drain terminal whereof is connected to the gate terminal of the first transistor 33. The source terminal of the third transistor 35 is connected to the power supply 36.

The enable terminal 30 is furthermore connected to the gate terminal of a fourth N-channel transistor 37. The drain terminal of the fourth transistor 37 is connected to the gate terminal of the first transistor 33 and to the drain terminal of the third transistor 35. The source terminal of the fourth transistor 37 is connected to the input terminal 31, which is connected to the gate terminal of a fifth N-channel transistor 38.

The source terminal of the fifth transistor 38 is connected to the ground, whereas the drain terminal of the fifth transistor 38 is connected to the source terminal of the second transistor 34.

The operation of this gate is described completely by table 1, wherein X is indicated when a value is of no interest, OFF indicates when a transistor is not on or when an enable signal is not active, ON indicates the condition opposite to OFF, and HI indicates the high-impedance state. In other words, to summarize, when a low logic value (OFF) occurs on the terminal 30, the output terminal 32 has a high impedance. Otherwise, if the terminal 30 has a high logic value (ON), the output terminal 32 has a logic value which is complementary to the logic value of the input terminal 31.

Figure 9:
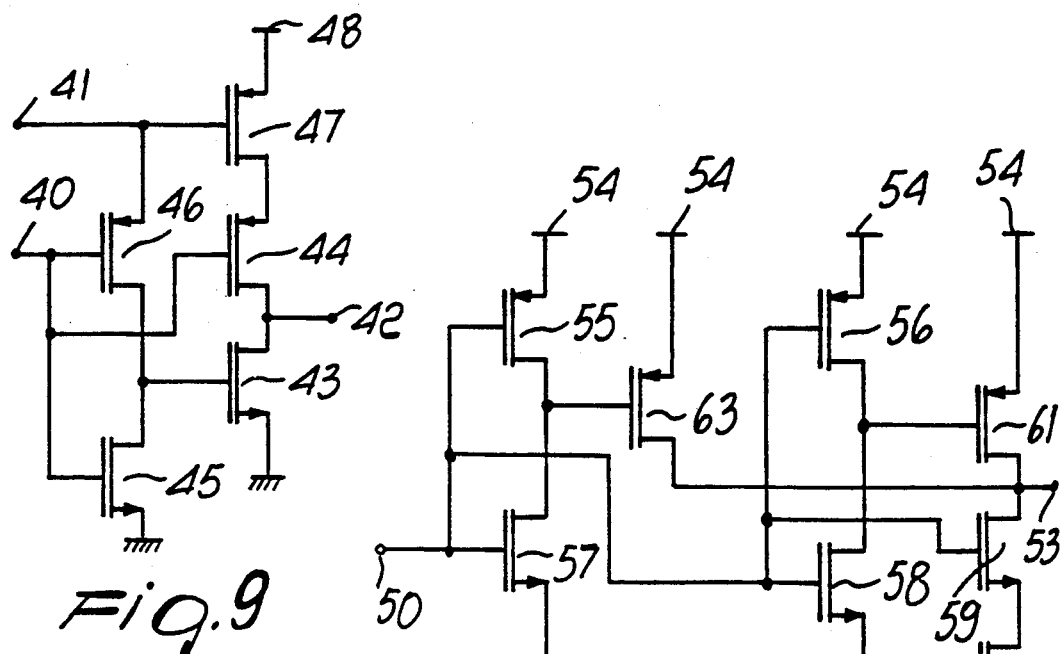
FIG. 9 is a view of a tristate inverting logic gate, made with a technology which is complementary to the gate of FIG. 8.

From the gate structure illustrated in FIG. 8 it is possible to obtain, by symmetry, an inverting logic gate structure in complementary technology, which is illustrated in FIG. 9 and described for the sake of completeness. A tristate inverting logic gate structure comprises a terminal 40 for an enable signal, a terminal 41 for an input signal, which connects, by virtue of signal switching means, a terminal for an output signal 42 to a positive power supply terminal 48 or to a negative power supply or ground terminal. The enable terminal 40 is connected to the gate terminal of a first N-channel transistor 43 and is connected to the gate terminal of a second P-channel transistor 44. The output terminal is connected to the node which is constituted by the drain terminals of the first transistor 43 and of the second transistor 44.

The enable terminal 40 is connected to the gate terminal of a third N-channel transistor, 45, the source terminal whereof is connected to the ground and the drain terminal whereof is connected to the gate terminal of the first transistor 43. The source terminal of the first transistor 43 is connected to the ground.

The enable terminal 40 is also connected to the gate terminal of a fourth P-channel transistor 46, the source terminal whereof is connected to the input terminal 41, whereas the drain terminal is connected to a node which is constituted by the gate terminal of the first transistor 43 and by the drain terminal of the third transistor 45.

The input terminal 41 is connected to the gate terminal of a fifth P-channel transistor 47 which has its source terminal connected to the power supply 48 and its drain terminal connected to the source terminal of the second transistor 44.

The operation of said inverting gate is completely described by table 2, wherein the symbols used have the same meaning as described above.

To summarize, when the enable terminal 40 is at a high logic level (ON), the terminal 42 has a high impedance, furthermore insulating the output terminal 42. Otherwise, if the enable terminal 40 is at a low logic level (OFF), the output terminal 42 has a logic value which is complementary to the logic value assumed by the input terminal 41.

The transistor 35 in FIG. 8 could theoretically not be necessary, but it is included in the gate structure according to the invention in order to ensure the state of the transistor 33, especially if there is a low logic value at the terminal 30. This insertion is due to the fact that, especially at high operating frequencies, charges can accumulate on the gate terminal of the transistor 33 and can lower the voltage of the gate terminal to a level sufficient to maintain the state of the transistor 33 as ON, i.e. conducting, thus connecting the output terminal 32 to the power supply 36 when the gate must instead be in the high-impedance state.

NOR gates and NAND gates have also been executed with the same concepts described above for tristate inverting gates.

Figure 10:
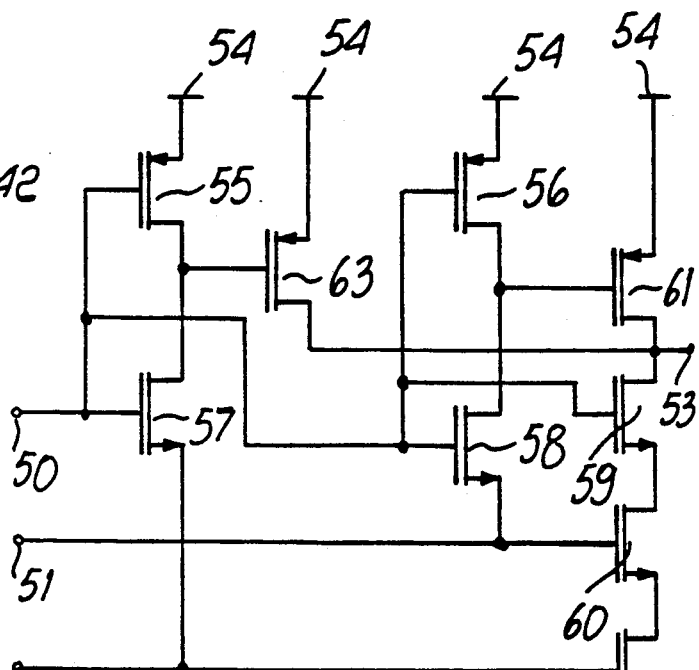
FIG. 10 is a schematic view of the execution of a tristate NAND logic gate.

With reference to FIG. 10, a tristate NAND logic gate structure comprises a terminal 50 for an enable signal, a first terminal 51 for a first input signal and a second terminal 52 for a second input signal. The enable terminal 50 is electrically connected to the gate terminal of a first P-channel transistor 55, to the gate terminal of a second P-channel transistor 56, to the gate terminal of a third N-channel transistor 57, to the gate terminal of a fourth N-channel transistor 58 and to the gate terminal of a fifth N-channel transistor 59. The transistors 55 to 59 can electrically insulate an output terminal 53.

The first input terminal 51 is connected to the gate terminal of a sixth N-channel transistor 60 and to the source terminal of the fourth transistor 58. The drain terminal of the fifth transistor 59 is connected to the drain terminal of a seventh P-channel transistor 61. The seventh transistor 61 has its source terminal connected to the power supply 54 and its gate terminal connected to a node which is constituted by the drain terminal of the fourth transistor 58 and by the drain terminal of the second transistor 56. The source terminal of the second transistor 56 is connected to the power supply 54.

The second input terminal 52 is connected to the gate terminal of an eighth N-channel transistor 62 and to the source terminal of the third transistor 57. The eighth transistor 62 has its source terminal connected to the ground and its drain terminal connected to the source terminal of the sixth transistor 60.

The third transistor 57 has its drain terminal connected to a node which is constituted by the drain terminal of the first transistor 55 and by the gate terminal of a ninth P-channel transistor 63. The first transistor 55 has its source terminal connected to the power supply 54 and the ninth transistor 63 has its source terminal also connected to the power supply 54.

The output terminal 53 is connected to a node which is constituted by the drain terminal of the seventh transistor 61, by the drain terminal of the fifth transistor 59 and by the drain terminal of the ninth transistor 63.

The operation of the tristate NAND gate is described completely by table 3, wherein the symbols used have the previously described meaning.

To summarize, when the enable terminal 50 has a low logic value (OFF), the terminal 53 has a high impedance and is electrically insulated. When the enable terminal 50 has a high logic value (ON), the output terminal 53 has a logic value which is complementary to the logic product of the input signals on the first and second input terminals 51 and 52 respectively.

Figure 11:
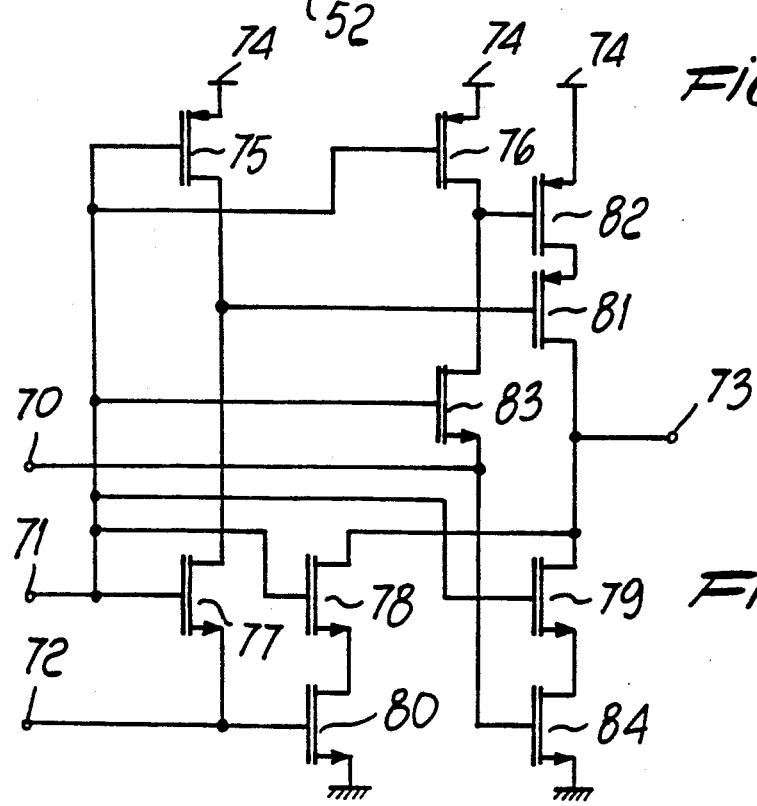
FIG. 11 is a schematic view of the execution of a tristate NOR logic gate.

With reference to FIG. 11, a tristate NOR logic gate structure comprises a terminal 71 for an enable signal, a first terminal 70 for a first input signal and a second terminal 72 for a second input signal.

The enable terminal 71 is connected to the gate terminal of a first P-channel transistor 75, to the gate terminal of a second P-channel transistor 76, to the gate terminal of a third N-channel transistor 77, to the gate terminal of a fourth N-channel transistor 78 and to the gate terminal of a fifth N-channel transistor 79. The transistors 75 to 79 can electrically insulate the output terminal 73.

The first transistor 75 has its source terminal connected to the power supply 74 and its drain terminal connected to the drain terminal of the third transistor 77; the latter has its source terminal connected to the second input terminal 72.

Said second input terminal 72 is connected to the gate terminal of a sixth N-channel transistor 80. Said sixth transistor 80 has its source terminal connected to the ground and its drain terminal connected to the source terminal of the fourth transistor 78; the latter has its drain terminal connected to the drain terminal of the fifth transistor 79.

The third transistor 77 has its drain terminal connected to the gate terminal of a seventh P-channel transistor 81. Said seventh transistor has its drain terminal connected to the drain terminal of the fifth transistor 79 and its source terminal connected to the drain terminal of an eighth P-channel transistor 82; said eighth transistor 82 has its source terminal connected to the power supply 74 and its gate terminal connected to the drain terminal of the second transistor 76.

The first input terminal 70 is connected to the source terminal of a ninth N-channel transistor 83 and to the gate terminal of a tenth N-channel transistor 84. The ninth transistor 83 has its gate terminal connected to the enabling terminal 71 and its drain terminal connected to the drain terminal of the second transistor 76. The tenth transistor 84 has its drain terminal connected to the source terminal of the fifth transistor 79 and its source terminal connected to the ground. The output terminal 73 is connected to a node which is constituted by the drain terminal of the seventh transistor 81, by the drain terminal of the fifth transistor 79 and by the drain terminal of the fourth transistor 78.

The operation of the tristate NOR gate is completely described by table 4, wherein the symbols used are the usual ones.

TABLE 1

| 31 | 30 | 35 | 33 | 34 | 37 | 38 | 32 |
|---|---|---|---|---|---|---|---|
| X | OFF | ON | OFF | OFF | OFF | X | HI |
| 0 | ON | OFF | ON | ON | ON | OFF | 1 |
| 1 | ON | OFF | OFF | ON | ON | ON | 0 |

TABLE 2

| 41 | 40 | 45 | 43 | 44 | 46 | 47 | 42 |
|---|---|---|---|---|---|---|---|
| X | ON | ON | OFF | OFF | OFF | X | HI |
| 0 | OFF | OFF | OFF | ON | ON | ON | 1 |
| 1 | OFF | OFF | ON | ON | ON | OFF | 0 |

TABLE 3

| 51 | 52 | 50 | 55 | 63 | 58 | 56 | 61 | 59 | 57 | 60 | 62 | 53 |
|---|---|---|---|---|---|---|---|---|---|---|---|---|
| X | X | OFF | ON | OFF | OFF | ON | OFF | OFF | OFF | X | X | HI |
| 0 | 0 | ON | OFF | ON | ON | OFF | ON | ON | ON | OFF | OFF | 1 |
| 0 | 1 | ON | OFF | OFF | ON | OFF | ON | ON | ON | OFF | ON | 1 |
| 1 | 0 | ON | OFF | ON | ON | OFF | OFF | ON | ON | ON | OFF | 1 |
| 1 | 1 | ON | OFF | OFF | ON | OFF | OFF | ON | ON | ON | ON | 0 |

TABLE 4

| 70 | 72 | 71 | 75 | 76 | 77 | 78 | 79 | 80 | 81 | 82 | 83 | 84 | 73 |
|---|---|---|---|---|---|---|---|---|---|---|---|---|---|
| X | X | OFF | ON | ON | OFF | OFF | OFF | X | OFF | OFF | OFF | X | HI |
| 0 | 0 | ON | OFF | OFF | ON | ON | ON | OFF | ON | ON | ON | OFF | 1 |
| 0 | 1 | ON | OFF | OFF | ON | ON | ON | ON | OFF | ON | ON | OFF | 0 |
| 1 | 0 | ON | OFF | OFF | ON | ON | ON | OFF | ON | OFF | ON | ON | 0 |
| 1 | 1 | ON | OFF | OFF | ON | ON | ON | ON | OFF | OFF | ON | ON | 0 |

To summarize, when the enable terminal 71 has a low logic value (OFF), the terminal 73 has a high impedance. When instead the enable terminal 71 has a high logic value (ON), the output terminal 73 assumes a logic value which is complementary with respect to the logic sum of the signals in input on the input terminals 70 and 72.

The NOR and NAND gate structures executed in complementary technology are obvious transformations of the above described gates.

The described gates achieve the intended aim and objects, as is evident from the above text. Especially, the circuital simplification introduced by eliminating an enable signal is evident.

Response to input signals is furthermore accelerated by reducing the series connections between P-channel transistors.

Finally, these structures are easy to integrate in any type of logic integrated circuit.

In practice, the materials employed, as well as the dimensions, may be any according to the requirements. The invention thus conceived is furthermore susceptible to numerous modifications and variations, all of which are within the scope of the inventive concept. All the details may furthermore be replaced with other technically equivalent ones.

We claim:

1. A CMOS output logic gate circuit connected between first and second power supplies for generating a output signal on a first terminal responsive to an input signal on a second terminal when said gate circuit is operational responsive to an enable signal on a third terminal, said output logic gate circuit comprising logic means connected to said second terminal and said third terminal for generating logic signals responsive to input and enable signals; and at least three serially connected MOS transistors, each having first and second source/drains and a gate, said source/drains serially connected between said first and second power supplies, one serial connection between said source/drains connected to said output terminal; said serially connected MOS transistors having a first serially connected MOS transistor connected between said first terminal and said second power supply, said first MOS transistor having a gate terminal connected to said third terminal so that said first MOS transistor is turned on and off responsive to a disable signal on said third terminal; and remaining serially connected MOS transistors, each having a gate connected to said logic means such that said remaining serially connected MOS transistors operate to generate on said first terminal a predetermined logic function of an input signal on said second terminal when said circuit is operational, said remaining serially connected MOS transistors including a second MOS transistor connected between said first terminal and said first power supply, said second serially connected MOS transistor responsive to said logic means so that said second MOS transistor is turned on and off responsive to an enable signal on said third terminal;

whereby said first terminal may be electrically isolated responsive to an enable signal on said third terminal.

2. The CMOS output logic gate circuit as in claim 1 wherein said first serially connected MOS transistor comprises a N-channel transistor having a first source/drain connected to said first terminal and a gate connected to said third terminal.

3. The CMOS output logic gate circuit as in claim 2 wherein said logic means comprises a first P-channel transistor and said second serially connected MOS transistor comprises a second P-channel transistor, said first P-channel transistor having first source/drain connected to said first power supply, a second source/drain connected to a gate of said second P-channel transistor and a gate connected to said third terminal.

4. The CMOS output logic gate circuit as in claim 3 wherein said logic means comprises a second N-channel transistor having a first source/drain connected to said second power supply, a second source/drain connected to said second source/drain of said first P-channel transistor, and a gate connected to said second terminal.

5. The CMOS output logic gate circuit as in claim 4 wherein said remaining serially connected transistors comprise a third N-channel transistor having a first source/drain connected to said second power supply, a second source/drain connected to a second source/drain of said first N-channel transistor, and a gate connected to said second terminal.

6. The CMOS output logic gate circuit as in claim 1 wherein said first serially connected MOS transistor comprises a P-channel transistor having a first source/drain connected to said first terminal and a gate connected to said third terminal.

7. The CMOS output logic gate circuit as in claim 6 wherein said logic means comprises a first N-channel transistor and said second serially connected MOS transistor comprises a second N-channel transistor, said first N-channel transistor having first source/drain connected to said first power supply, a second source/drain connected to a gate of said second N-channel transistor and a gate connected to said third terminal.

8. The CMOS output logic gate circuit as in claim 7 wherein said logic means comprises a second P-channel transistor having a first source/drain connected to said second power supply, a second source/drain connected to said second source/drain of said first N-channel transistor, and a gate connected to said third terminal.

9. The CMOS output logic gate circuit as in claim 8 wherein said remaining serially connected transistors comprise a third P-channel transistor having a first source/drain connected to said second power supply, a second source/drain connected to a second source/drain of said first P-channel transistor, and a gate connected to said second terminal.

10. A CMOS NOR output logic gate circuit connected between first and second power supplies for generating a output signal on a first terminal responsive to input signals on a second and third terminal when said gate circuit is operational responsive to an enable signal on a fourth terminal, said NOR output logic gate circuit comprising logic means connected to said second, third and fourth terminals for generating logic signals responsive to input and enable signals;

first and second MOS transistors, each transistor having first and second source/drains and a gate, said first MOS transistor having a first source/drain connected to said first power supply and a second source/drain connected to a first source/drain of said second MOS transistor, said second MOS transistor having a second source/drain connected to said first terminal;

third and fourth MOS transistors, each transistor having first and second source/drains and a gate, said third MOS transistor having a first source/drain connected to said second power supply and a second source/drain connected to said first source/drain of said fourth MOS transistor, said fourth MOS transistor having a second source/drain connected to said first terminal;

fifth and sixth MOS transistors, each transistor having first and second source/drains and a gate, said fifth MOS transistor having a first source/drain connected to said second power supply and a second source/drain connected to said first source/drain of said sixth MOS transistor, said sixth MOS transistor having a second source/drain connected to said first terminal;

said fourth and sixth MOS transistors each having a gate terminal connected to said fourth terminal so that said fourth and sixth MOS transistors are turned on and off responsive to a disable signal on said fourth terminal; and said first, second, third, and fifth MOS transistors each having a gate connected to said logic means such that said first, second, third, and fifth MOS transistors operate to generate on said first terminal a NOR logic function of input signals on said second and third terminals when said circuit is operational, said first and second MOS transistors further responsive to said logic means so that at least one of said first and second MOS transistors are turned on and off responsive to an enable signal on said fourth terminal;

whereby said first terminal may be electrically isolated responsive to an enable signal on said fourth terminal.

11. A CMOS NOR output logic gate circuit as in claim 10 wherein said logic means comprises first and second sublogic means;

said first sublogic means connected to said second and fourth terminals, to the gate of one of said first and second MOS transistors, and to the gate of said third MOS transistor so that responsive to a signal on said second terminal either said one of said first and second MOS transistors or said third MOS transistor is on when said circuit is operational; and said second sublogic means connected to said third and fourth terminals, to the gate of the other of said first and second MOS transistors, and to the gate of said fifth MOS transistors so that responsive to a signal on said third terminal either said other of said first and second MOS transistors or said fifth MOS transistor is on when said circuit is operational.

12. A CMOS NOR output logic gate circuit as in claim 11 wherein said first and second MOS transistors comprise P-channel transistors, and said third, fourth, fifth and sixth MOS transistors comprise N-channel transistors.

13. A CMOS NOR output logic gate circuit as in claim 12 wherein said first sublogic means comprises seventh and eighth MOS transistors, each having first and second source/drains and a gate;
said seventh MOS transistor having a first source/drain connected to said first power supply, a second source/drain connected to a gate of said second MOS transistor and a gate connected to said fourth terminal;
said eight MOS transistor having a first source/drain connected to a gate of said fifth MOS transistor and to said second terminal, a second source/drain connected to said second source/drain of said seventh MOS transistor and a gate connected to said fourth terminal.

14. A CMOS NOR output logic gate circuit as in claim 13 wherein said seventh MOS transistor comprises a P-channel transistor and said eighth MOS transistor comprises a N-channel transistor.

15. A CMOS NOR output logic gate circuit as in claim 12 wherein said second sublogic means comprises ninth and tenth MOS transistors, each having first and second source/drains and a gate;
said ninth MOS transistor having a first source/drain connected to said first power supply, a second source/drain connected to a gate of said first MOS transistor and a gate connected to said fourth terminal;
said tenth MOS transistor having a first source/drain connected to a gate of said third MOS transistor and to said third terminal, a second source/drain connected to said second source/drain of said ninth MOS transistor and a gate connected to said fourth terminal.

16. A CMOS NOR output logic gate circuit as in claim 15 wherein said ninth MOS transistor comprises a P-channel transistor and said tenth MOS transistor comprises a N-channel transistor.

17. A CMOS NAND output logic gate circuit connected between first and second power supplies for generating a output signal on a first terminal responsive to input signals on a second and third terminal when said gate circuit is operational responsive to an enable signal on a fourth terminal, said NAND output logic gate circuit comprising
logic means connected to said second, third and fourth terminals for generating logic signals responsive to input and enable signals;
first and second MOS transistors, each having first and second source/drains and a gate, said source/drains of said MOS transistors connected in parallel between said first terminal and said first power supply;
third, fourth and fifth MOS transistors, each having first and second source/drains and a gate, said source/drains of said MOS transistors serially connected between said first terminal and said second power supply, said third MOS transistor having a gate terminal connected to said fourth terminal so that said third MOS transistor is turned on and off responsive to a disable signal on said fourth terminal; and
said first, second, fourth and fifth MOS transistors, each having a gate connected to said logic means such that said MOS transistors operate to generate on said first terminal a NAND logic function of input signals on said second and third terminals when said circuit is operational, said first and second MOS transistors responsive to said logic means so that said first and second MOS transistors are turned on and off responsive to an enable signal on said fourth terminal;
whereby said first terminal may be electrically isolated responsive to an enable signal on said fourth terminal.

18. A CMOS NAND output logic gate circuit as in claim 17 wherein said logic means comprises first and second sublogic means;
said first sublogic means connected to said second and fourth terminals, to the gate of said first MOS transistor and to the gate of one of said fourth and fifth MOS transistors so that responsive to a signal on said second terminal either said first MOS transistor or said one of said fourth and fifth MOS transistor is on when said circuit is operational; and
said second sublogic means connected to said third and fourth terminals, to the gate of said second MOS transistor and to the gate of the other of said fourth and fifth MOS transistors so that responsive to a signal on said third terminal either said second MOS transistor or said other of said fourth and fifth MOS transistors is on when said circuit is operational.

19. A CMOS NAND output logic gate circuit as in claim 18 wherein said first and second MOS transistors comprise P-channel transistors, and said third, fourth, and fifth MOS transistors comprise N-channel transistors.

20. A CMOS NAND output logic gate circuit as in claim 19 wherein said first sublogic means comprises sixth and seventh MOS transistors, each having first and second source/drains and a gate;
said sixth MOS transistor having a first source/drain connected to said first power supply, a second source/drain connected to a gate of said first MOS transistor and a gate connected to said fourth terminal;
said seventh MOS transistor having a first source/drain connected to a gate of said fifth MOS transistor and to said second terminal, a second source/drain connected to said second source/drain of said sixth MOS transistor and a gate connected to said fourth terminal.

21. A CMOS NAND output logic gate circuit as in claim 20 wherein said sixth MOS transistor comprises a P-channel transistor and said seventh MOS transistor comprises a N-channel transistor.

22. A CMOS NAND output logic gate circuit as in claim 19 wherein said second sublogic means comprises eighth and ninth MOS transistors, each having first and second source/drains and a gate;
said eighth MOS transistor having a first source/drain connected to said first power supply, a second source/drain connected to a gate of said second MOS transistor and a gate connected to said fourth terminal;
said ninth MOS transistor having a first source/drain connected to a gate of said fifth MOS transistor and to said third terminal, a second source/drain connected to said second source/drain of said eighth MOS transistor and a gate connected to said fourth terminal.

23. A CMOS NOR output logic gate circuit as in claim 22 wherein said eighth MOS transistor comprises a P-channel transistor and said ninth MOS transistor comprises a N-channel transistor.

* * * * *